United States Patent
Birleson (10) Patent No.: US 7,171,176 B1
(45) Date of Patent: Jan. 30, 2007

(54) TUNER SYSTEM SELF ADAPTIVE TO SIGNAL ENVIRONMENT

(75) Inventor: S. Vincent Birleson, West Tawakoni, TX (US)

(73) Assignee: Microtune (Texas), L.P., Plano, TX (US)

(*) Notice: Subject to any disclaimer, the term of this patent is extended or adjusted under 35 U.S.C. 154(b) by 0 days.

(21) Appl. No.: 09/224,219

(22) Filed: Dec. 30, 1998

(51) Int. Cl.
*H04B 1/18* (2006.01)
*H04B 1/16* (2006.01)
*H03J 3/00* (2006.01)

(52) U.S. Cl. .............. 455/173.1; 455/200.1; 455/180.2; 334/40

(58) Field of Classification Search ............ 455/180.2, 455/62, 164.2, 166.1, 173.1, 185, 161, 164, 455/169, 182, 257, 259, 260, 180.3, 180.4, 455/254, 266, 234.1, 180.1, 76, 226.1, 67.11, 455/67.12, 77, 160.1, 200.1, 69; 348/10, 348/11; 334/40
See application file for complete search history.

(56) References Cited

U.S. PATENT DOCUMENTS

| | | | | |
|---|---|---|---|---|
| 4,127,819 A | * | 11/1978 | Keane | 331/96 |
| 4,419,768 A | * | 12/1983 | Yamashita et al. | 455/180.1 |
| 4,733,301 A | * | 3/1988 | Wright, Jr. | 455/5 |
| 4,742,566 A | | 5/1988 | Nordholt et al. | |
| 5,023,934 A | * | 6/1991 | Wheeless | 455/45 |
| 5,038,404 A | | 8/1991 | Marz | |
| 5,060,297 A | | 10/1991 | Ma et al. | |
| 5,210,504 A | * | 5/1993 | Yagita et al. | 330/253 |
| 5,262,769 A | * | 11/1993 | Holmes | 340/7.42 |
| 5,557,337 A | * | 9/1996 | Scarpa | 348/558 |
| 5,564,092 A | * | 10/1996 | Grandfield et al. | 455/232.1 |
| 5,590,156 A | * | 12/1996 | Carney | 375/316 |
| 5,842,119 A | * | 11/1998 | Emerson et al. | 455/161.3 |
| 5,870,439 A | * | 2/1999 | Ben-Efraim et al. | 375/346 |
| 5,907,798 A | * | 5/1999 | Abramsky et al. | 455/249.1 |
| 5,949,472 A | * | 9/1999 | Dang et al. | 455/180.1 |
| 5,994,955 A | | 11/1999 | Birkeland | |
| 6,014,547 A | * | 1/2000 | Caporizzo et al. | 455/188.1 |
| 6,243,570 B1 | * | 6/2001 | Kobayashi | 455/340 |
| 6,285,865 B1 | | 9/2001 | Vorenkamp et al. | |
| 6,452,644 B1 | * | 9/2002 | Shimakawa et al. | 348/730 |
| 6,498,926 B1 | * | 12/2002 | Ciccarelli et al. | 455/240.1 |

FOREIGN PATENT DOCUMENTS

EP 0876057 A2 * 11/1998

OTHER PUBLICATIONS

Meyer, Robert G. "A 1-GHz BiCMOS RF Front-End IC." IEEE Journal of Solid-State Circuits; vol. 29 No. 3 (Mar. 1994): 350-355.
Bult, Klaas, and Govert Geelen. "An Inherently Linear and Compact MOST-Only Current-Division Technique." 1992 IEEE International Solid-State Circuits Conference Digest of Technical Papers. (1992). 198-199.

(Continued)

*Primary Examiner*—Tilahun Gesesse
(74) *Attorney, Agent, or Firm*—Fulbright & Jaworski LLP (57) ABSTRACT

A circuit and method for adjusting the operating characteristics of a tuner in accordance with information derived from the signals being processed by the tuner. Depending upon signal type and/or signal strength, the power levels of certain components are adjusted and/or certain components are added to (or subtracted from) the tuner.

48 Claims, 6 Drawing Sheets

OTHER PUBLICATIONS

Giles, Martin. "The LM 1823: A High Quality TV Video I.F. Amplifier and Synchronous Detector for Cable Receivers." National Semiconductor Corporation. (Mar. 1985). 1-16.

Svelto, F., et al. "A Low-Voltage Topology After CMOS RF Mixers." IEEE Transactions on Consumer Electronics., vol. 45, No. 2 (May 1999). 299-309.

MC44302: Advanced Multi-Standard TV Video/Sound IF. Motorola, Inc. (Jun. 17, 1994).

Maier, Gerd M. "New System Approach to TV Tuner Design." IEEE Transactions on Consumer Electronics, vol. 36, No. 3. (Aug. 1990). 403-406.

Benson, K. Blair. "Receivers" Television Engineering Handbook. (1986) 13. 114-13.117.

Sabin, William E. & Edgar O. Schoenike. "Single -Sideband Systems & Circuits." McGraw Hill Book Company. New York. (1987). 88-134, 181-213.

* cited by examiner

TUNER SYSTEM SELF ADAPTIVE TO SIGNAL ENVIRONMENT

REFERENCE TO RELATED APPLICATIONS

Reference is also made to the following and commonly assigned U.S. patent application entitled BROADBAND INTEGRATED TELEVISION TUNER, filed Aug. 1, 1997, Ser. No. 08/904,908 U.S. Pat. No. 6,177,964.

TECHNICAL FIELD

This invention relates to tuner designs and more particularly to a tuner system which allows for minimum power consumption.

BACKGROUND

Tuners do the selecting of desired signals from the total band of regard. For example, a television tuner may tune from channel 2 through channel 100, selecting a desired channel 8. In doing so, tuners must work in a variable signal environment, and thus are designed for satisfactory performance in the worse case environment.

It is well known in the art that the power consumption and dissipation for a tuner is very dependent on the tuner's linearity requirements, which are driven by characteristics of the incoming signal environment. It is also well known that a dense signal environment with large variation in individual signal strength requires a very linear receiver to avoid distorting the desired received signal. Conversely, environments with few signals with constant individual signal strengths require less linearity to avoid distortion.

Signals, depending on their use, have a maximum distortion level, above which there is definite performance degradation. Thus, tuners must be designed to produce no more than the maximum exceptable distortion when confronted with the worse case environment. When the severity of the environment is less than anticipated, the tuner is "over designed" requiring more power than if it was designed for the more benign-environment. Turners are designed with a simple power level and this power level is dependant upon tuner design which, in turn, causes turner to be designed using maximum power levels.

Consequently, it is desirable to provide a tuner that requires only the power necessary to achieve exceptable distortion levels in a worse case and benign environments.

SUMMARY OF THE INVENTION

These and other objects, features and technical advantages are achieved by a system and method in which the tuner system is environmentally adaptive, only requiring maximum power in the worse case environment. In the more typical, more benign environment, the consumed power is just enough to provide the required system performance.

The tuner system consists of four main blocks, Environmental Assessment (EA), Assessment to Power Required (APR) converter, Power Control (PC), and the basic tuner. The EA determines the severity of the signal environment and passes that information to the APR converter. The APR converts the environmental data to the needed power required to meet overall system requirements and allocate the power requirements across the tuner where power control is available. The PC performs the required power control through switches and/or continuously variable controls. The tuner receives the desired signals, filters out the undesired signals, and in so doing, provides the required system performance, using only the necessary power level as set by the system depending upon the received signals.

Environmental Assessment can be performed in using a variety of different techniques, two of which are: 1) use of an inband detector and a control processor to sweep the frequencies of regard, and 2) use of a signal amplitude detector in the front-end of the tuner with inband signal level monitoring.

Method 1) is the most accurate of the two methods but requires the processor, during an inactive time, to sweep all available channels and to save the signal levels and number of "active" channels. An example of an inactive time is during the setup period when all channels are usually monitored to assess quality of the signal. This should be adequate for cable TV signals. Terrestrial broadcast may require monitoring during channel selection for a mobile-environment, since signal strengths may vary with time. The inband or "current channel" signal level can be obtained from the swept data or through the tuner's Received Signal Strength Indicator (RSSI).

Method 2) employs a signal level detector in the front end of the tuner to monitor the total signal power, utilizing a Total Signal Power Indicator (TSPI). This requires the processor to only monitor the result of this measurement and the output of the RSSI. This method takes very little processor and dedicated tuner time, but is somewhat less accurate than Method 1. The most accurate approach would utilize both methods, Method 1 primarily for cable and Method 2 for terrestrial broadcast.

Assessment to Power Required (APR) converter is a process that utilizes the acquired knowledge of the environment to determine the correct amount of power reduction. The input signal type is known in most TV sets through selection during setup or automatically determined by the processor by measuring certain channel frequencies. The signal power levels are found through the methods described above.

Accordingly, it is a technical feature of my invention that a turner system adjusts to a power level dependent upon detected signal types.

It is a technical feature on my invention that a tuner system scans the input signals to determine the power level that will be adequate for proper functioning of the tuner.

A further technical advantage of my invention is the design of a tuner which minimizes power consumption under adaptive control.

DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
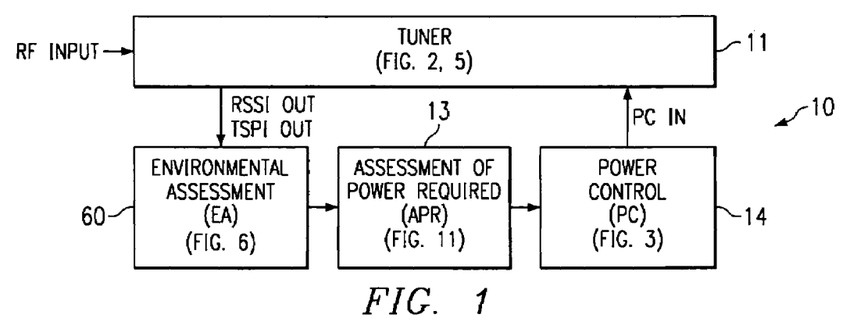
FIG. 1 is a block diagram of the Environmentally Adaptive Tuner System.

FIG. 1 is the top level diagram of the Environmentally Adaptive Tuner System (EATS) 10 wherein:

Tuner 11 is a tuner of current art adaptable to provide signals to Environmental Assessment 60 and to accept signals from Power Control 14. Examples of such tuners were shown in FIGS. 2 and 5.

Environmental Assessment (EA) 60 assesses the incoming signals and provides; depending on method, signal count, power levels, and signal types to Assessment of Power Required, block 13. The EA function is further described in FIG. 6.

Assessment of Power Required 13 (APR) uses algorithms to determine how much Direct Current (DC) power is required for each of the power control blocks in Tuner 11. This result is signaled to the Power Control 14 function. APR algorithms are explained in the Detailed Description section.

Power Control 14 provides the circuitry required to vary (control) the DC power to each of the tuner's "power control blocks" to utilize only the power necessary to provide the required performance level.

Figure 2:
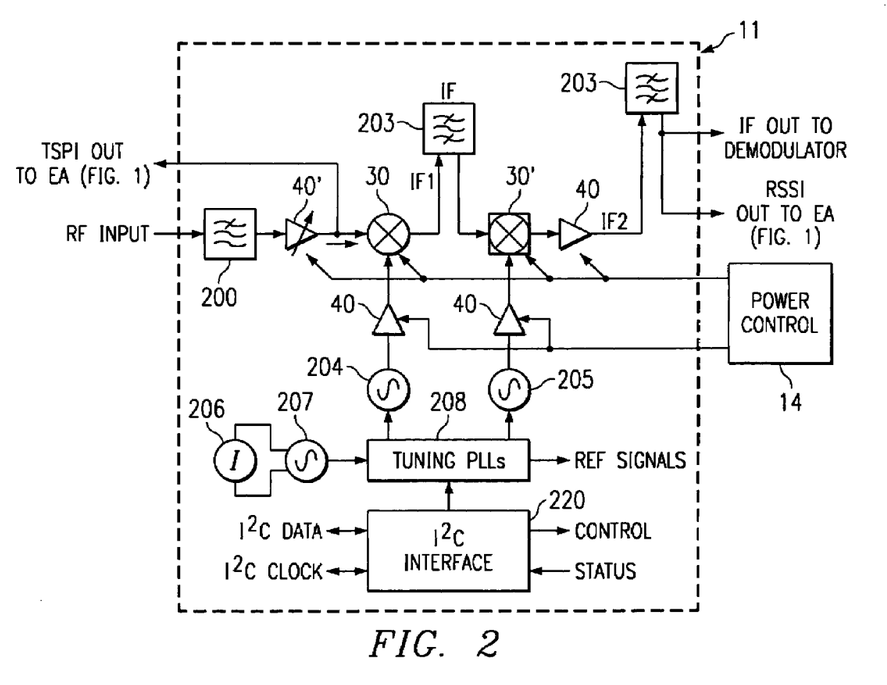
FIG. 2 is a schematic of a tuner that provides an Intermediate Frequency (IF) output.

FIG. 2 is a schematic of a tuner that provides an Intermediate Frequency (IF) output, indicating the interfaces that include the outputs to Environmental Assessment (EA) 60 and the inputs from Power control (PC) 14. TSPI (Total Signal Power Indicator) and RSSI (Receive Signal Power Indicator) go to EA 60. PC 14 provides DC power control to amplifiers 40 and 40' and mixers 30 and 30'.

Figure 3:
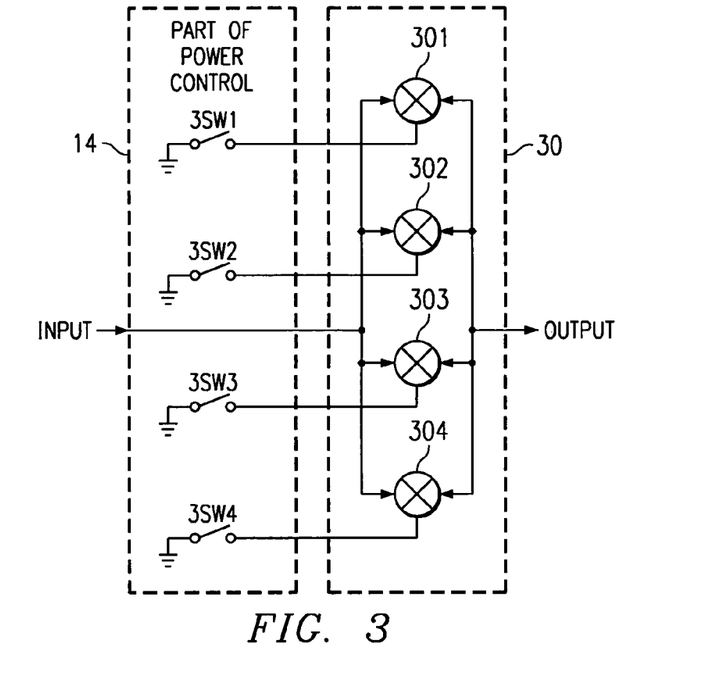
FIG. 3 is an example of a power control mixer.

FIG. 3 is an example of how DC power control of mixer 30 can be accomplished. In this case mixer 30 is made up of 4 mixers wired in parallel, with separate switches to enable/disable power supply current flow to each of the mixers 301 through 304. Power Control switches 3SW1 through 3SW4 just enough of the mixers 301 through 304 to provide only the required performance determined by the APR function 13.

Figure 4:
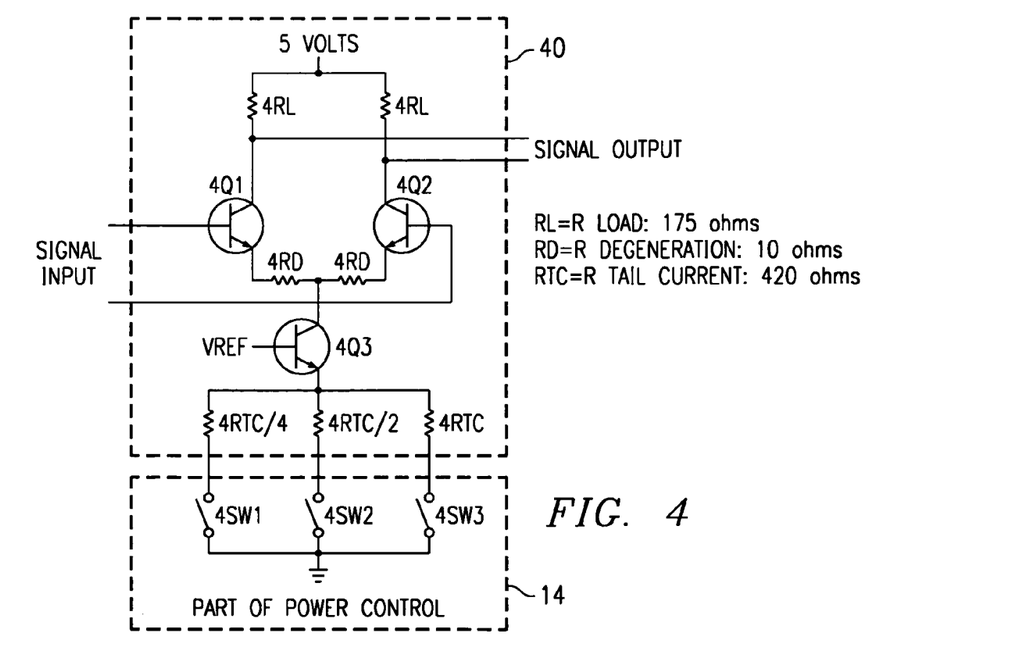
FIG. 4 is an example of a DC power control amplifier.

FIG. 4 is an example of how DC power of amplifier 40 can be accomplished. In this case amplifier 40 has 3 different resisters that can be independently selected to select 7 different DC power consumption states. The resister values have a binary relationship so that the current that goes through the amplifier varies from the minimum with just 4RTC selected by closing only switch 4SW3 to a minimum with all switches (4SW1, 4SW2, and 4SW3 closed).

Figure 5:
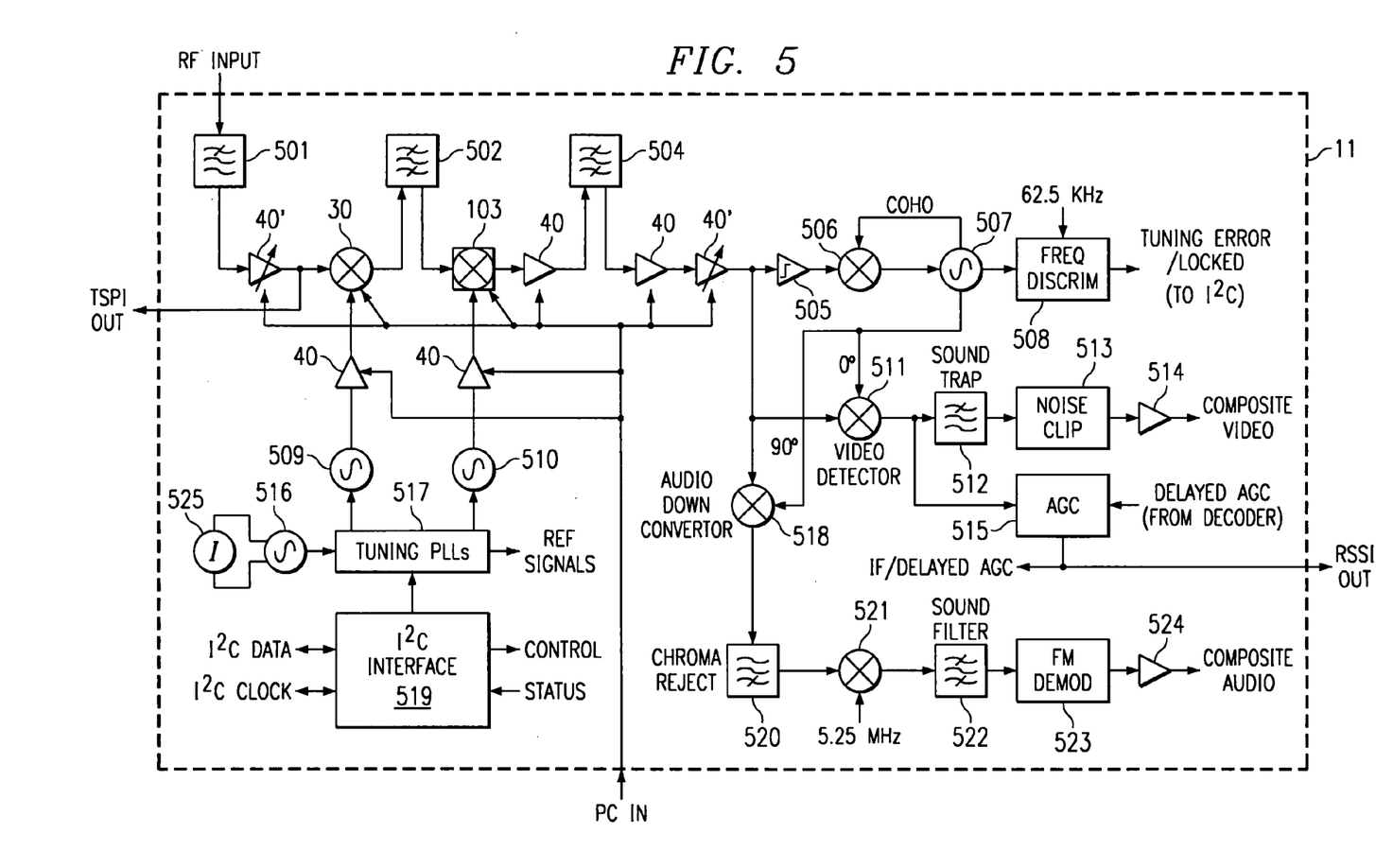
FIG. 5 is a schematic of a tuner that provides composite Video and Audio outputs.

FIG. 5 is a schematic of a tuner that provides composite Video and Audio outputs, indicating the interfaces that include the outputs to the Environmental Assessment (EA) function 60 and the inputs from the Power Control (PC) function 14. The TSPI (Total Signal Power Indicator) and the RSSI (Receive Signal Power Indicator) go to the EA function. The PC function provides DC power control to amplifiers 40 and 40' and mixers 30 and 30'. A more defined description of this circuit can be found in patent application entitled BROADBAND INTEGRATED TELEVISION TUNER, filed Aug. 1, 1997, Ser. No. 08/904,908 incorporated herein by reference.

Figure 6:
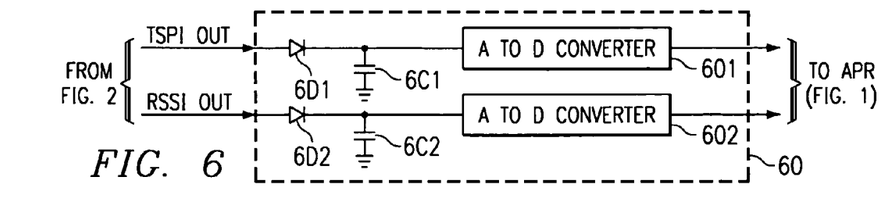
FIG. 6 is a schematic of amplitude detectors and analog to digital conversion.

FIG. 6 is a schematic of amplitude detectors and analog to digital conversion utilized to provide signal power indication to the APR function 13. 6D1 and 6D2 are diodes that rectify the signal, to provide current to capacitors 6C1 and 6C2. The capacitors are chosen to bypass the carrier but not the envelope frequency, thus providing an amplitude that is proportional to the signal power presented to the diodes 6D1 and 6D2.

Figure 7A:
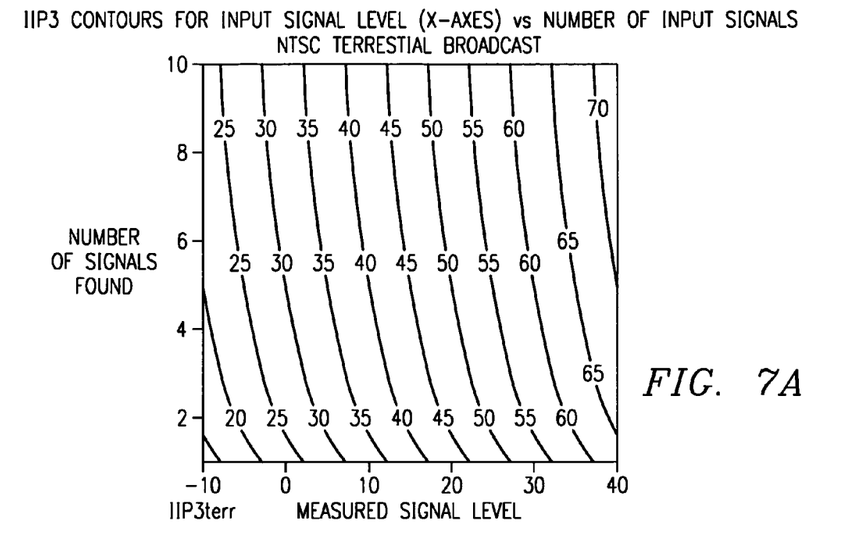
FIG. 7A is a plot of the input third order intercept point IIP3 as a function of the measured signal level and the number of signals found at that signal level for NTSC Terrestrial.

FIG. 7A is a plot of the required input third order intercept point IIP3 as a function of the measured signal level and the number of signals found at that signal level for NTSC terrestrial broadcast. This function is based on cross modulation performance which, in this case, maintain no worse than 1% cross modulation level.

Figure 7B:
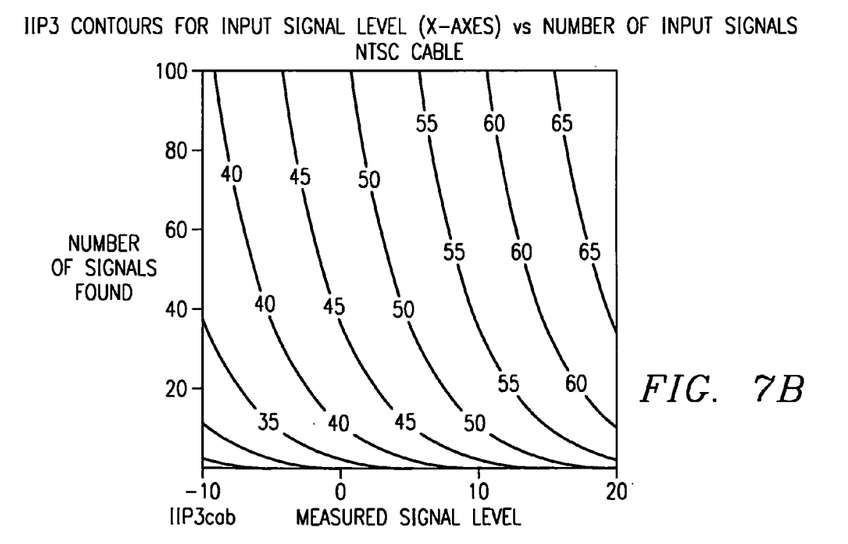
FIG. 7B is equivalent to FIG. 7A for NTSC cable.

FIG. 7B is equivalent to FIG. 7A but for NTSC cable. In this case the Composite Triple Beats (CTB) is to be no worse than −57 dBc (decibels below the carrier).

Figure 8:
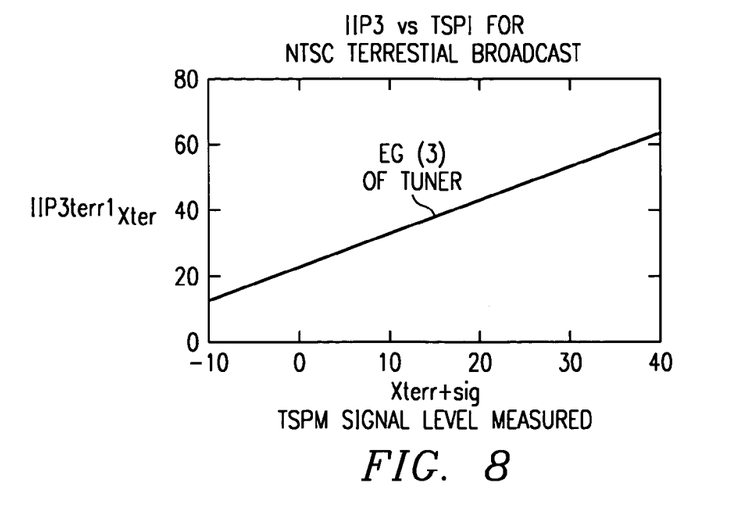
FIG. 8 is a plot of the required IIP3 to maintain a 1% cross modulation as a function of the signal level of one undesired signal.

FIG. 8 is similar to FIG. 7A, but since terrestrial NTSC typically has one large signal that dominates the undesired signals arriving at the tuner, this FIGURE is a plot of the required IIP3 to maintain a 1% cross modulation as a function of the signal level of one undesired signal.

Figure 9:
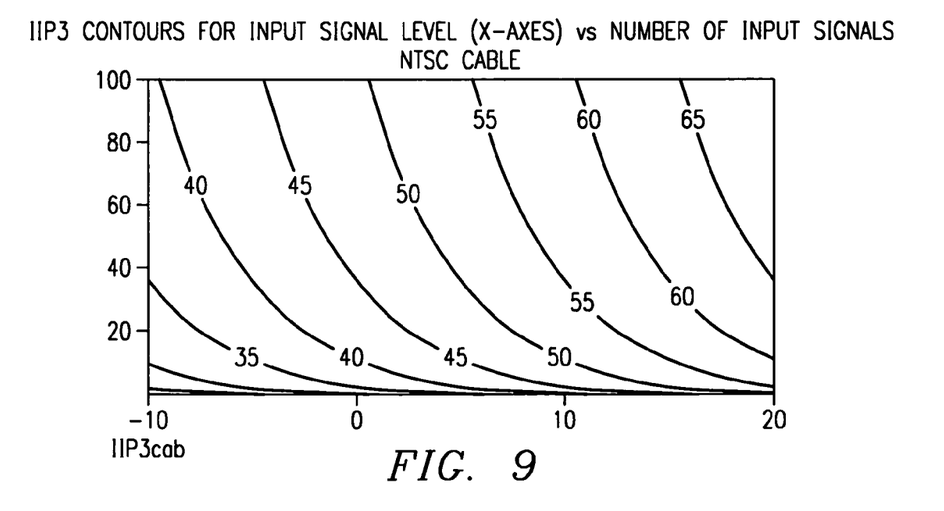
FIG. 9 is equivalent to 7B except a Receive Signal Strength Indicator (RSSI) which measures the inband signal strength which determines the input signal level.

FIG. 9 is equivalent to 7b except a Receive Signal Strength Indicator (RSSI) which measures the inband signal strength determines the input signal level.

Figure 10:
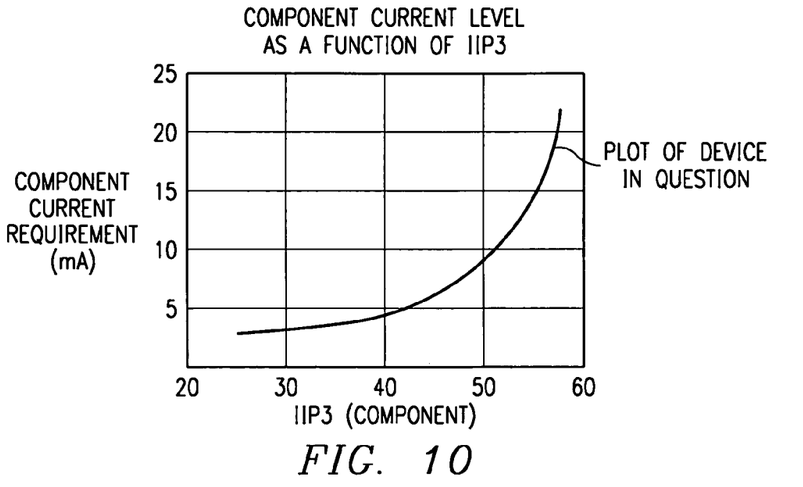
FIG. 10 is an example of the current required for a tuner component verses the required IIP3 for that component.

FIG. 10 is an example of the current required for a tuner component verses the required IIP3 for that component. The power required for a component is directly related to the required current.

Figure 11:
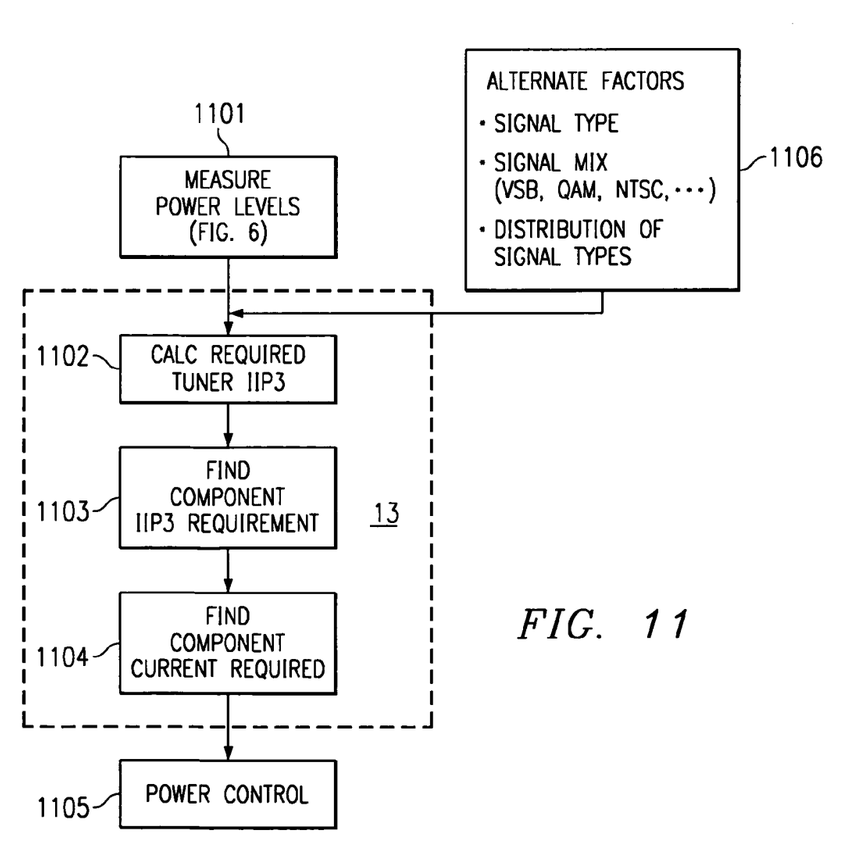
FIG. 11 is a flow diagram for the environmentally adaptive tuner system.

FIG. 11 is a flow diagram for EATS. The first function makes the power measurements using either of the two procedures, with an without Processor Controlled Sweep. This result used along with alternate factors are passed to the second function which calculates the required IIP3 for the tuner. Alternate factors include such items as signal types, mix of signal types (how many of the different types), and distribution of the signal types. The signal types include: "Digital"; 8VSB, 64QAM, 256QAM and "Analog" NTSC, PAL. Distribution of signal include: "upper half of channels digital", "intermixed analog and digital channels". The tuner IIP3 is passed to the next function which determines the IIP3 required for each of the "power controllable" components. This result is then passed to the function which finds the current required for each of the "controllable" components. This result is then supplied to the power Control function which controls the power to each of the "controllable" components.

Turning now to FIG. 1, as shown in block diagram of the tuner system and method 10 of my invention. Tuner 11 is shown with an RF input, outputs to the Environmental Assessment 60, and inputs from the Power Control 14. Further detail of tuner 11 is provided in FIG. 2 and FIG. 5.

Both FIGS. 2 and 5 show the TSPI output from amplifier 40' and RSSI output from filter 203 in FIG. 2 and an RSSI output from the AGC function 515 in FIG. 5 that is provided to Environmental Assessment 60.

Environmental Assessment (EA) 60 utilize these signals to determine, depending on method, signal count, power levels, and signal types to the Assessment of Power Required 13 function. The EA function is further described in FIG. 6. While two methods of Environmental Assessment will be described here, other combinations of measurement techniques could also be formed and utilized in the EA function 60.

Method one performs a sweep across all channels received, analyzing one channel at a time (much like the "setup procedure" performed with prior art TV systems. The second method uses the Total Signal Power Indicator and does not utilize the channel sweep. The second method can provide continuous updates on the signal environment, but may be less accurate. Of course both methods may be used, the "Channel Sweep Method" initially then the "Static Method" to provide updates, mostly for mobile systems.

The EA function 60 when using the Channel Sweep Method utilizes the RSSI signal to determine the inband signal strength (the signal power for the selected channel). In this mode the control processor will accumulate the RSSI result along with signal type data which can come from the tuner, from the demodulation functions, or from "TV guide" data, for each channel during the channel sweep process.

The EA function 60 when using the Static Method utilizes the Total Signal Power Indicator TSPI to estimate the total power, across all channels, coming into the tuner. It also utilizes the RSSI signal to determine the power being received for the currently selected channel.

When utilizing the TSPI signal, the total power at the input of the tuner can be estimated by adjusting A to D converter 601 output (FIG. 6) for the gain through 6D1, 6C1, A to D converter 601 and LNA 40'.

When utilizing the RSSI signal the total power at the input of the tuner can be estimated by adjusting the A to D converter 601 output (FIG. 6) for the gain through 6D1, 6C1, the A to D converter, and LNA 40', mixer 30, first IF filter 502, second mixer 103, amplifiers 40 and 40', video detector 511, and ADC function 515.

Assessment of Power Required 13 (APR) function uses algorithms to determine how much Direct Current (DC) power is required for each of the power control blocks in Tuner 11. This result is signaled to Power Control 14 function.

Three algorithmic steps are utilized to determine the current required for each controllable component as illustrated in FIG. 11, item 13. First the tuner IIP3 (third order input intercept), the second order input intercept may also be utilized for some channel selections, is calculated 1102. Then the component IIP3 requirements 1103, here the IIP2 may be also utilized, are found that will yield the required tuner IIP3. The component current required 1104, which when multiplied by the voltage across the component is the power consumed by the part, is then found that will provide the needed component intercept point. The component current requirement is then passed to the power control function 1105.

The tuner IIP3 algorithms 1102 utilized are dependent on the Environmental Assessment method (Channel Sweep or Static Method) and signal transmission medium (terrestrial or cable) and the signal type (analog, i.e., NTSC or digital, i.e, 8VSB or 256 QAM). For signal type we will discuss analog NTSC, other signal types are readily adaptable to these algorithms.

The Channel Sweep Method is the most accurate but requires the processor, during an inactive time, to sweep all available channels and save the signal levels and number of "active" channels. An example of an inactive time, is during the setup period when all channels are usually monitored to assess quality of the signal. This should be very adequate for cable TV. Terrestrial broadcast may required monitoring during channel selection for a mobile environment, since signal strengths may vary with time. The inband or "current channel" signal level can be obtained from the swept data or through the tuners Received Signal Strength Indicator (RSSI).

For terrestrial broadcast the IIP3 can be determined from the largest (strongest) signal received during the sweep utilizing equation 1.

$$\text{Tuner IIP3} = \text{Max\_Signal} - \text{Xmod}/2 \qquad \text{(Equ 1)}$$

Where:
Max_Signal is the maximum signal strength received from the channel sweep, referred to the tuner input.
Xmod is the maximum cross modulation distortion sideband level specified. For example 1% cross modulation has −46 dBc sidebands.

For cable and NTSC analog broadcast the algorithm utilizes the average signal power received for each of the channels and the number of channels received to calculate the tuner IIP3 in dBmV, and is presented in equation 2. FIG. 7B is a plot of Tuner IIP_3 for NTSC cable as a function of the average signal level received (Avg_Signal) and the number of signal received (CabSigs).

$$\text{Tuner IIP3} = \text{Avg\_Signal} + \{-\text{CTB} + 6 + 10*\log[(3/8)*(\text{CabSigs}+1)^2]\}/2 \qquad \text{(Equ 2)}$$

Where:
Avg_Signal is the average signal level received in dBmV, referred to the tuner input.
CTB is the specified Composite Triple Beat level.
CabSigs is the number of cable signals received.

The static method utilizes a signal level detector monitoring the RF input, such as following the VLNA 40', and the inband Receive Signal Strength Indicator (RSSI) outputs inband signal strength. The tuner will also output the amount of gain control provided to the VLNA. If this is not available, the processor has the Take Over Point (TOP) for the VLNA and can calculate the amount of gain control provided to the VLNA.

For terrestrial, there are relatively few signals (compared to cable) so a good estimate for the required IIP3 can assume a single signal to give equation (3) and is plotted in FIG. 8.

$$\text{Tuner}IIP3 = \text{Signal\_In} + \frac{-xmod}{2} \qquad \text{(Equ 3)}$$

Where (Signal_In) is the measured the signal level referred to the input of the tuner, for example in dB units $$\text{Signal\_In} = \text{Measured\_Level} - \text{VLNA\_gain} + \text{VLNA\_attenuation} \qquad \text{(Equ 4)}$$

For cable by measuring the total input power, as in terrestrial above, and knowing the inband power from the RSSI measurement, the number of channels received can be estimated. The RSSI provides the estimate for the cable signal strength. The number of channels, "Cabsigs" in cable equations below, is (in linear units):
With the input signal level equal to:

$$\text{Input\_Level} = \text{Measured\_Level} + \text{VLNA\_attenuation\_VLNA\_gain} \qquad \text{(Equ 5)}$$

Where:
Measured_Level is the measured RMS voltage level following the VLNA 40' in dBmV VLNA_attenuation is the attenuation level set in the VLNA 40' in dB VLNA_gain is the VLNA 40' gain in dB Gives the number of channels of:

$$CabSigs = \frac{10^{(\text{Input\_Level}/10)}}{10^{(RSSI/10)}} \quad \text{(Equ. 6)}$$

Where:

RSSI is the Received Signal Strength Indication in dBmV and referred to the tuner input.

The component IIP3 requirements are then determined 1103 from the tuner IIP3. This can be a lookup table or a simple algorithm than returns the IIP3 for each of the "IIP3 adjustable" components. The IIP3 of the components will generally change proportionally with the tuner IIP3, so that a 10 dB reduction in the tuner IIP3 will cause a 10 dB reduction in the component IIP3.

The component current requirements 1104 are then found from the component IIP3 requirements 1103. FIG. 10 is an example plot of how component tuner requirements can vary as a function of component IIP3 requirement. This function can also be a lookup table or a simple algorithm.

This result is then passed to the Power Control 1105 function which actually changes the current utilized by the components in the tuner. Examples of the Power Control function are given in FIG. 3 for a mixer component and in FIG. 4 for an amplifier function.

With RSSI expressed in dB being equal to:

$$RSSI_{Xcab} := Xcab + sig \quad \text{(Equ. 7)}$$

$$IIP3cab_{Xcab,Cabsigs} := \quad \text{(Equ. 8)}$$

$$RSSI_{Xcab} + \frac{-CTB + 6 + 10 \cdot \log\left[\left(\frac{3}{8}\right)(CabSigs + 1)^2\right]}{2}$$

One approach is to separately control functions in the tuner with each having a lookup table in the processor that provides the proper control vs. required IIP3. Note this could also be performed off IIP2, but the IIP3 is typically the driver. The functions to control are, for example, VLNA, MIX1, MIX2, FGA, LO1, LO2.

IIP3 requirements also vary with signal types. For example, in order of increasing IIP3 requirements, 8VSB, 64QAM, 256QAM and NTSC. This information is known to processor block 1106 FIG. 11, and can be utilized through an additional axis on the lookup tables. Note the lookup tables could be replaced with a closed form algorithm for each function. Also rather than controlling each function separately, a power down control word could be provided and each function would self control in accordance with control word.

Power Control (PC) function 1105 is incorporated into the tuner and provides a means to vary the power consumption for each variable power function. FIGS. 3 and 4 are examples of power control for a mixer and an amplifier, respectively.

Amplifier 40 (FIG. 4) has three control switches (45W1, 45W2, and 45W3) to provide seven levels of power control. The setting with all 3 switches closed provides the best distortion performance at maximum current (power with constant supply voltage). The power can then be reduced by up to 85% in seven steps with the corresponding reduction in performance, which, depending on the signal input type and the selected power level should not be harmful to the operation of the circuit.

Mixer example 30 shown in FIG. 3 has four levels of performance and power consumption. This circuit performs the power/performance control by selecting (via 35W1, 35W2, 35W3, 35W4) the number of mixer cores 301–304 to run in parallel. The more mixer cores there are, the more power is used and the higher the performance. With all 4 mixer cores turned on full performance is obtained, consuming the most power. The power can then be reduced by 0.25, 0.5, and 0.75 with a corresponding reduction in power, again by selecting the power level bases on signal type and requirements no degraduation of the tuner output is.

A single mixer core could also utilize the variable tail current method to vary power/performance in mixer structures such as a "Gilbert Cell".

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

Although the present invention and its advantages have been described in detail, it should be understood that various changes, substitutions and alterations can be made herein without departing from the spirit and scope of the invention as defined by the appended claims.

What is claimed is:

1. A tuner for extracting specific signals from a set of signals on a carrier wherein the set of signals have at least one of a set of measurable characteristics, said tuner comprising:

means for determining from a measurement of the measurable characteristics which are present in a particular set of signals input to said tuner certain desirable tuner operating characteristics; and means operable under control of said determining means for changing the operating characteristics of said tuner, wherein said operating characteristics changing means includes means for changing power consumption levels with respect to certain of said tuner components to meet desired tuner output characteristics when processing said specific signals of said set of signals having said characteristics using an optimized tuner power level.

2. The invention set forth in claim 1 wherein said operating characteristics changing means includes:

means for determining optimum operating characteristics for said tuner depending upon said determined operating characteristics.

3. The system set forth in claim 2 wherein said operating characteristics changing means includes:

means for changing power levels with respect to certain of said tuner components, said power levels changed to the determined optimum level.

4. The invention set forth in claim 1 wherein said tuner is constructed on a single substrate.

5. A method of operating a tuner, said method comprising the steps of:

assessing from time to time the incoming signal environment, wherein an assessment of said incoming signal environment is a function of the signals then being processed by said tuner;

based upon said assessed incoming signal environment selecting an operating level for said tuner, wherein said selecting step includes the step of selecting an optimum power consumption level for said tuner; and setting the operation of said tuner consistent with said selected operating level.

6. The method of claim 5 wherein said step of selecting an optimum power consumption level includes selecting optimum power levels for certain components of said tuner.

7. A method of operating a tuner, said method comprising the steps of determining optimal tuner power consumption from knowledge of the signals being processed by the tuner; and adjusting the tuner power consumption in accordance with said determining step, wherein said adjusting step includes the step of adjusting power consumption of certain tuner components within said tuner to achieve a desired intercept point for each component of said certain tuner components.

8. The method of claim 7 wherein said determining step includes the step of:

taking signal measurements of the signal being processed by the tuner.

9. The method of claim 8 wherein said signal measurement step includes the step of:

determining total power across all channels.

10. The method of claim 7 wherein said determining step includes the step of:

receiving information from an external source.

11. The method of claim 7 wherein said determining step includes the step of:

monitoring the RF input and the inband receive signal strength.

12. The method set forth in claim 7 wherein said step of adjusting power consumption of certain components within said tuner includes the step of:

controlling current levels of said certain tuner components.

13. The method set forth in claim 7 wherein said determining step includes using channel sweep and static methods of signal analysis at different times.

14. The method set forth in claim 7 wherein said adjusting step includes the step of:

adjusting the number of components that are active at any particular time.

15. A tuner comprising:

a circuit for determining acceptable tuner power consumption from knowledge of the input signals being processed by the tuner; and at least one circuit for adjusting the tuner power consumption in accordance with said determining circuit, wherein said adjusting circuit adjusts the power consumption of certain tuner components within said tuner, as said tuner actively processes said input signals.

16. The tuner of claim 15 wherein said determining circuit includes a circuit for taking signal measurements of the signal being processed by the tuner.

17. The tuner of claim 16 wherein said signal measurement circuit includes a circuit for determining total power across all channels.

18. The tuner of claim 15 wherein said determining circuit includes a circuit for reviewing information from an external source.

19. The tuner of claim 15 wherein said determining circuit includes a circuit for monitoring the RF input and the inband receive signal strength.

20. The tuner of claim 15 wherein said adjusting circuit adjusts the current levels of said certain tuner components within said tuner.

21. The tuner of claim 15 wherein said determining circuit includes channel sweep circuitry and static determination circuitry, which circuitry is operable at different times.

22. A tuner comprising:

circuitry for determining desired power consumption of certain tuner components from knowledge of the input signals being processed by the tuner; and circuitry operable in cooperation with said determining circuitry for adjusting the power consumption of said certain tuner components to achieve a desired component intercept point.

23. The tuner of claim 22 wherein said determining circuit includes circuitry for taking signal measurements of the signal being processed by the tuner.

24. The tuner of claim 22 wherein said adjusting circuitry controls current levels of said certain components.

25. The tuner of claim 22 wherein said adjusting circuitry adds or subtracts said certain components into or out of said tuner.

26. The tuner of claim 22 wherein said determining circuit includes channel sweep circuitry and static determination circuitry operable at different times.

27. A tuner operable for extracting certain signals from a set of signals, said tuner operable with at least two different signal sets, each signal set having a different operation characteristic, said tuner including:

determination circuitry for identifying which signal set is being processed at a point in time and determining an appropriate power level for each of a plurality of tuner components of said tuner for processing said signal set; and adjustment circuitry operable in cooperation with said determination circuitry for implementing said power levels with respect to said tuner components in accordance with the signal set then being processed.

28. The tuner of claim 27 wherein said adjustment circuitry is operable in cooperation with said determination circuitry for changing the component mix of said tuner.

29. The tuner of claim 27 wherein said determination circuitry includes channel sweep circuitry.

30. The tuner of claim 27 wherein said determination circuitry includes static determination circuitry.

31. The tuner of claim 27 wherein said determination circuitry includes both channel sweep circuitry and static determination circuitry.

32. The tuner of claim 31 wherein said channel sweep circuitry and said static determination circuitry are operable at different times.

33. A system for processing signals, said system comprising:

means for providing input signal environmental assessment, wherein an input signal environment assessed by said input signal environmental assessment means comprises a set of signals;

means for determining a power level from input signal environmental assessment information, wherein said power level determining means is coupled to said input signal environmental assessment means for communication of said input signal environmental assessment information;

means for providing power control in accordance with determined power level information, wherein said power control means is coupled to said power level determining means for communication of said determined power level information; and means for tuning a selected signal from said set of signals, wherein said tuning means is coupled to said power control means for power control of said tuning means by said power control means.

34. The system of claim 33, wherein said input signal environmental assessment means determines a signal density with respect to said set of input signals.

35. The system of claim 33, wherein said input signal environmental assessment means comprises:

means for sweeping signals of said set of signals and acquiring signal level information with respect thereto.

36. The system of claim 33, wherein said input signal environmental assessment means comprises:

means for acquiring a total signal power level associated with said set of signals.

37. The system of claim 33, wherein said power level determining means utilizes acquired knowledge of the environment to determine a correct amount of power reduction to be applied to said tuner.

38. The system of claim 33, wherein said power level determining means utilizes a third order input intercept of said tuner in providing said determined power level information.

39. The system of claim 33, wherein said power control means comprises:

means for changing current utilized by components of said tuner.

40. The system of claim 33, wherein said power control means comprises:

means for selecting mixer cores from a plurality of mixer cores of said tuner for use in processing a signal.

41. A method for processing signals, said method comprising:

providing input signal environmental assessment, wherein an input signal environment assessed comprises a set of signals;

determining a power level from input signal environmental assessment information obtained from said input signal environmental assessment;

providing power control in accordance with determined power level information obtained from said determining a power level from said input signal environmental assessment information; and tuning a selected signal from said set of signals, wherein a power level of a tuner providing said tuning is controlled by said power control provided in accordance with said determined power level information.

42. The method of claim 41, wherein said input signal environmental assessment is determined at least in part using a signal density with respect to said set of input signals.

43. The method of claim 41, wherein said input signal environmental assessment comprises:

sweeping signals of said set of signals and acquiring signal level information with respect thereto.

44. The method of claim 41, wherein said input signal environmental assessment comprises:

acquiring a total signal power level associated with said set of signals.

45. The method of claim 41, wherein said determining said power level comprises:

acquiring knowledge of the signal environment to determine a correct amount of power reduction to be applied to said tuner.

46. The method of claim 41, wherein said determining said power level comprises:

utilizing information with respect to a third order input intercept of said tuner in providing said determined power level information.

47. The method of claim 41, wherein said determining said power control comprises:

changing current utilized by components of said tuner.

48. The method of claim 41, wherein said determining said power control comprises:

selecting mixer cores from a plurality of mixer cores of said tuner for use in processing a signal.

* * * * *